(12) United States Patent
Revier et al.

(10) Patent No.: US 10,553,573 B2
(45) Date of Patent: Feb. 4, 2020

(54) SELF-ASSEMBLY OF SEMICONDUCTOR DIE ONTO A LEADFRAME USING MAGNETIC FIELDS

(71) Applicant: Texas Instruments Incorporated, Dallas, TX (US)

(72) Inventors: Daniel Lee Revier, Addison, TX (US); Steven Alfred Kummerl, Carrollton, TX (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/693,985

(22) Filed: Sep. 1, 2017

(65) Prior Publication Data

US 2019/0074270 A1  Mar. 7, 2019

(51) Int. Cl.
*H01L 23/31* (2006.01)
*H01L 23/367* (2006.01)
*H01L 23/495* (2006.01)
*H01F 7/02* (2006.01)
*H01F 7/20* (2006.01)
(Continued)

(52) U.S. Cl.
CPC ........... *H01L 25/50* (2013.01); *H01F 7/0252* (2013.01); *H01F 7/206* (2013.01); *H01L 21/687* (2013.01); *H01L 23/3107* (2013.01); *H01L 23/367* (2013.01); *H01L 23/49575* (2013.01)

(58) Field of Classification Search
CPC ....................................................... H01L 25/50
See application file for complete search history.

(56) References Cited

U.S. PATENT DOCUMENTS

| 3,868,759 | A | * | 3/1975 | Hartleroad | ........ | H01L 21/67144 |
| | | | | | | 198/381 |
| 3,868,764 | A | * | 3/1975 | Hartleroad | ............. | B23K 1/012 |
| | | | | | | 228/123.1 |
| 4,974,590 | A | | 12/1990 | Saito | | |

(Continued)

FOREIGN PATENT DOCUMENTS

| SU | 1780469 A1 | 10/1995 |
| WO | 2006101577 A2 | 9/2006 |
| WO | 2017111892 A1 | 6/2017 |

OTHER PUBLICATIONS

Optical Sensor-On-Chip ICs Simplify Handheld Spectrometer Design, available at https://www.digikey.com/en/articles/techzone/2017/jun/optical-sensor-on-chip-ics-simplify-handheld-spectrometer-design, Digi-Key Electronics, Jun. 28, 2017, pp. 1-6.

(Continued)

*Primary Examiner* — William A Harriston
(74) *Attorney, Agent, or Firm* — Michael A. Davis, Jr.; Charles A. Brill; Frank D. Cimino

(57) ABSTRACT

Integrated circuits may be assembled by placing a batch of integrated circuit (IC) die on a leadframe. Each of the IC die includes a magnetically responsive structure that may be an inherent part of the IC die or may be explicitly added. The IC die are then agitated to cause the IC die to move around on the leadframe. The IC die are captured in specific locations on the leadframe by an array of magnetic domains that produce a magnetic response from the plurality of IC die. The magnetic domains may be formed on the lead frame, or may be provided by a magnetic chuck positioned adjacent the leadframe.

18 Claims, 14 Drawing Sheets

(51) Int. Cl.
*H01L 25/00* (2006.01)
*H01L 21/687* (2006.01)

(56) References Cited

U.S. PATENT DOCUMENTS

| | | | |
|---|---|---|---|
| 4,999,587 A | | 3/1991 | Evans |
| 5,355,577 A | * | 10/1994 | Cohn .................... B82Y 30/00 29/592.1 |
| 5,500,912 A | | 3/1996 | Alonas et al. |
| 5,528,074 A | | 6/1996 | Goto et al. |
| 5,834,320 A | | 11/1998 | Huddleston et al. |
| 6,664,615 B1 | | 12/2003 | Bayan et al. |
| 6,967,347 B2 | | 11/2005 | Estes et al. |
| 6,979,105 B2 | | 12/2005 | Leysath |
| 7,228,016 B2 | | 6/2007 | Beausoleil |
| 7,305,161 B2 | | 12/2007 | Zhou |
| 7,733,198 B1 | | 6/2010 | Olsson et al. |
| 8,031,012 B2 | | 10/2011 | Hasegawa |
| 8,054,145 B2 | | 11/2011 | Mohammadi et al. |
| 8,094,023 B1 | | 1/2012 | El-Kady et al. |
| 8,138,868 B2 | | 3/2012 | Arnold |
| 8,143,637 B2 | | 3/2012 | Kanatake |
| 8,587,182 B2 | | 11/2013 | Reiche |
| 9,018,074 B2 | | 4/2015 | Zhang et al. |
| 9,070,703 B2 | | 6/2015 | Haroun et al. |
| 9,123,737 B2 | | 9/2015 | Haroun et al. |
| 9,306,263 B2 | | 4/2016 | Herbsommer et al. |
| 9,343,426 B1 | | 5/2016 | Parvarandeh |
| 9,373,878 B2 | | 6/2016 | Schuppener et al. |
| 9,450,563 B2 | | 8/2016 | Gorisse et al. |
| 9,583,811 B2 | | 2/2017 | Seler et al. |
| 9,647,329 B2 | | 5/2017 | Herbsommer et al. |
| 9,651,718 B2 | | 5/2017 | Chen et al. |
| 10,062,583 B2 | | 8/2018 | Costa et al. |
| 10,139,564 B1 | | 11/2018 | Homeijer et al. |
| 2005/0224956 A1 | | 10/2005 | Kao et al. |
| 2006/0038168 A1 | | 2/2006 | Estes et al. |
| 2006/0054780 A1 | | 3/2006 | Garrood et al. |
| 2007/0108545 A1 | | 5/2007 | Chua et al. |
| 2008/0112665 A1 | | 5/2008 | Beausoleil et al. |
| 2008/0218299 A1 | | 9/2008 | Arnold |
| 2009/0288852 A1 | | 11/2009 | Hirokawa et al. |
| 2010/0019247 A1 | | 1/2010 | Joichi et al. |
| 2011/0001233 A1 | | 1/2011 | Iwase et al. |
| 2011/0089815 A1 | | 4/2011 | Yeh et al. |
| 2011/0103632 A1 | | 5/2011 | Leclair et al. |
| 2011/0133597 A1 | | 6/2011 | Pavlov et al. |
| 2011/0221057 A1 | | 9/2011 | Lin et al. |
| 2012/0043628 A1 | | 2/2012 | Martin et al. |
| 2012/0098611 A1 | | 4/2012 | Sinha et al. |
| 2012/0154168 A1 | | 6/2012 | Duncan et al. |
| 2013/0038174 A1 | | 2/2013 | Kim et al. |
| 2013/0228796 A1 | | 9/2013 | Mieczkowski |
| 2014/0287703 A1 | | 9/2014 | Herbsommer et al. |
| 2014/0326902 A1 | | 11/2014 | Tahan et al. |
| 2015/0237423 A1 | | 8/2015 | Bahr et al. |
| 2015/0295305 A1 | | 10/2015 | Herbsommer et al. |
| 2016/0028367 A1 | | 1/2016 | Shealy |
| 2016/0276311 A1 | | 9/2016 | Meyer et al. |
| 2016/0327977 A1 | | 11/2016 | Tang et al. |
| 2017/0084519 A1 | | 3/2017 | Speight et al. |
| 2017/0108655 A1 | | 4/2017 | Zarbock et al. |
| 2017/0186793 A1 | | 6/2017 | Ockenfuss |
| 2017/0253476 A1 | | 9/2017 | Shibuya et al. |
| 2017/0276870 A1 | | 9/2017 | Snyman |
| 2017/0288123 A1 | | 10/2017 | Hatano et al. |
| 2017/0292884 A1 | | 10/2017 | Ching, Jr. et al. |

OTHER PUBLICATIONS

Hideo Kosaka et al, "Self-Collimating Phenomena in Photonic Crystals", Applied Physics Letters, vol. 74, No. 9, Mar. 1, 1999, pp. 1212-1214.
Phonon, Wikipedia, available at https://en.wikipedia.org/wiki/Phonon on Aug. 2, 2017, pp. 1-9.
Yan Pennec and Bahram Djafari-Rouhani, "Fundamental Properties of Phononic Crystal", Chapter 2 in "Phononic Crystals", 2016, pp. 23-50.
Daniel Frederic Sievenpiper, "High-Impedance Electromagnetic Surfaces", 1999, University of California, pp. 1-162.
Nagi Elabbasi, "Modeling Phononic Band Gap Materials and Structures", Comsol Blog, Feb. 10, 2016, pp. 1-7.
Dr. Qin Hu, "Multiphoton Lithograpy Based 3D Micro/Nano Printing", EPSRC Centre for Innovative Manufacturing in Additive Manufacturing, pp. 1-30.
Standard Terminology for Additive Manufacturing Technologies, ASTM International, F2792-12a, Sep. 9, 2013, pp. 1-3.
7 Families of Additive Manufacturing, According to ASTM F2792 Standards, Hybrid Manufacturing Technologies, pp. 1-2.
International Search Report for PCT/US2018/049166 dated Dec. 13, 2018.
International Search Report for PCT/US2018/049135 dated Dec. 13, 2018.
International Search Report for PCT/US2018/058478 Feb. 14, 2019.
Mohammadi, et al. Complete phononic bandgaps and bandgap maps in two-dimensional silicon phononic crystal plates; Electronics Letters Aug. 2, 2017, vol. 43 No. 16. 2 pages.
International Search Report for PCT/US2018/058481 dated Feb. 7, 2019.
International Search Report for PCT/US2018/058487 dated Feb. 14, 2019.
International Search Report for PCT/US20181057358 dated Feb. 7, 2019.
International Search Report for PCT/US2018/057351 dated Feb. 7, 2019.
International Search Report for PCT/US2018/058494 dated Feb. 21, 2019.

* cited by examiner

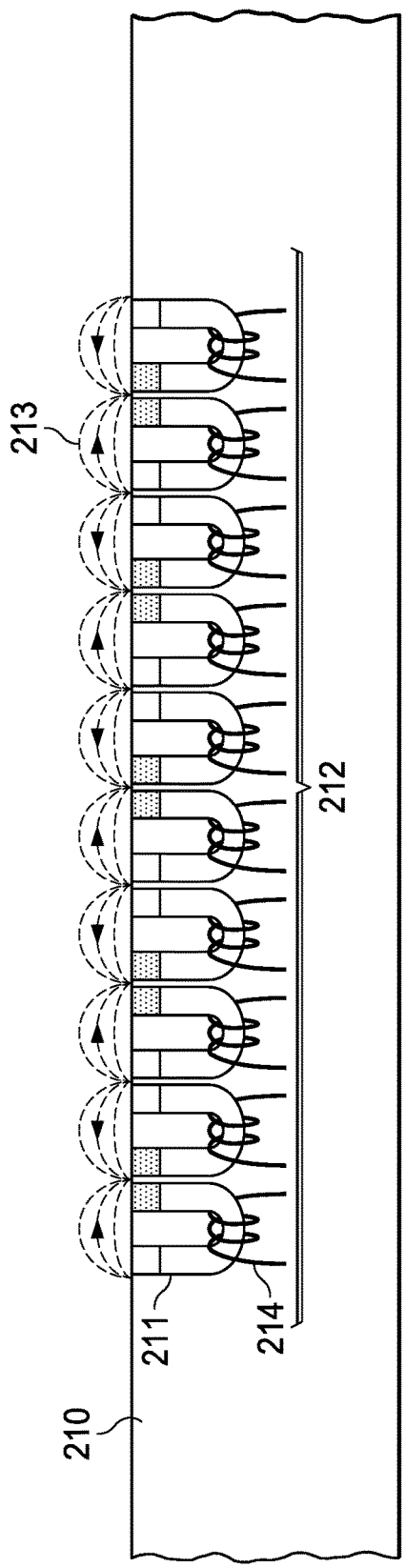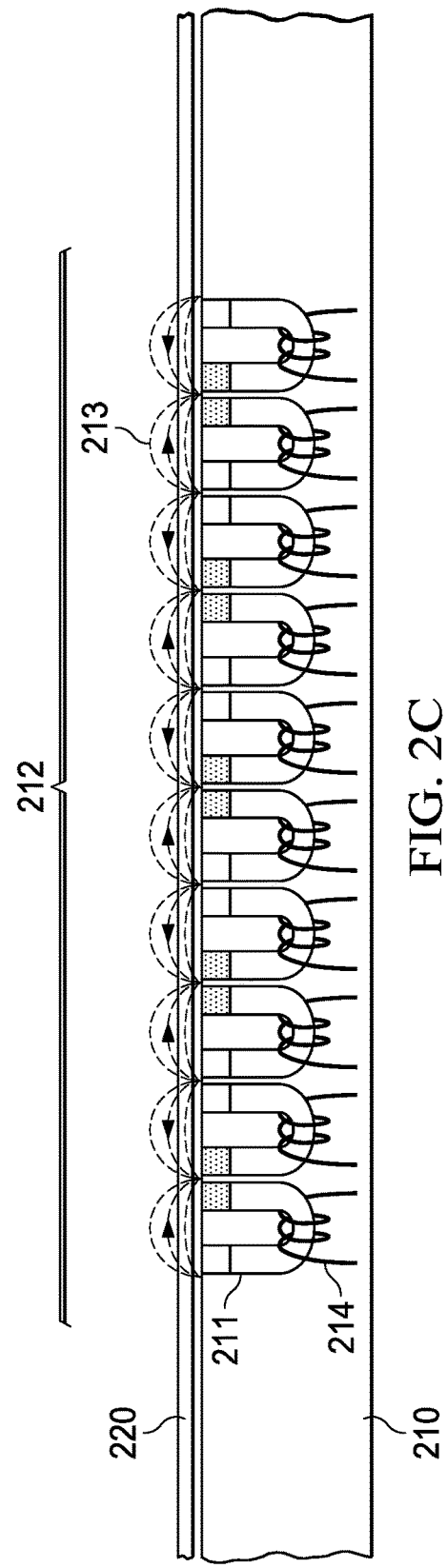
FIG. 2B
FIG. 2C

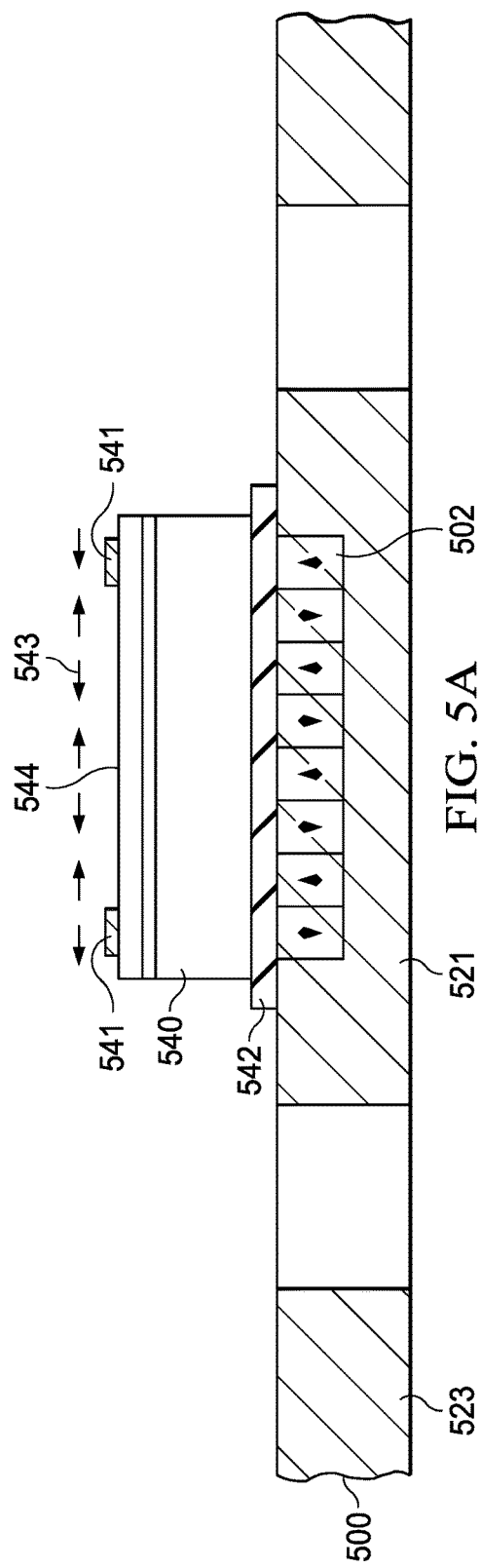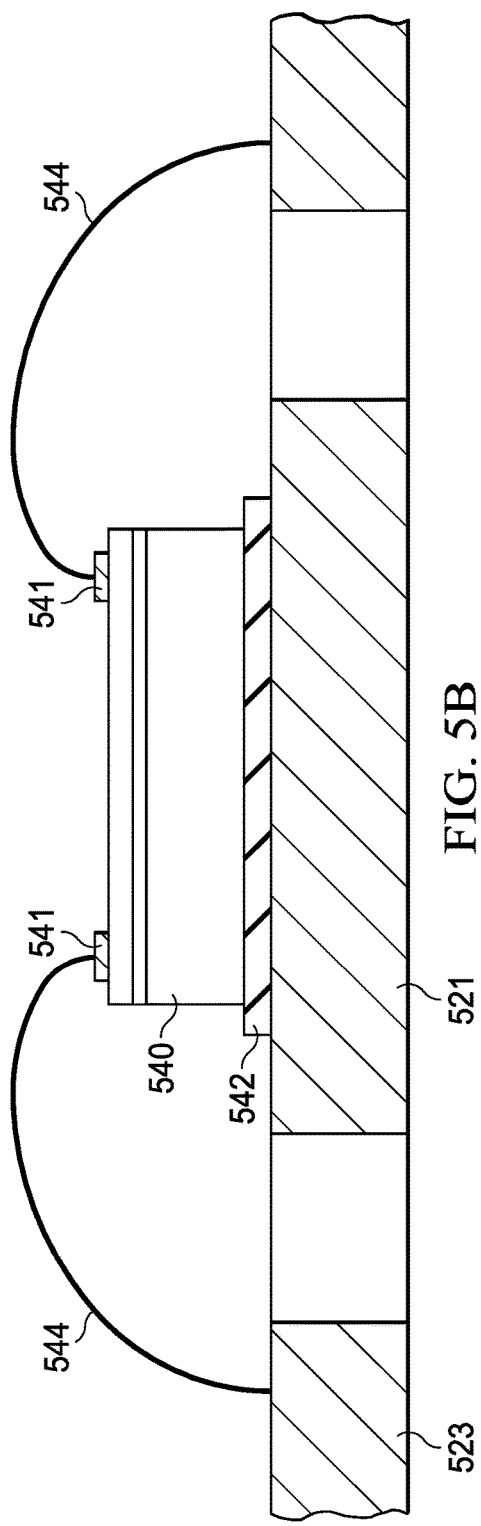

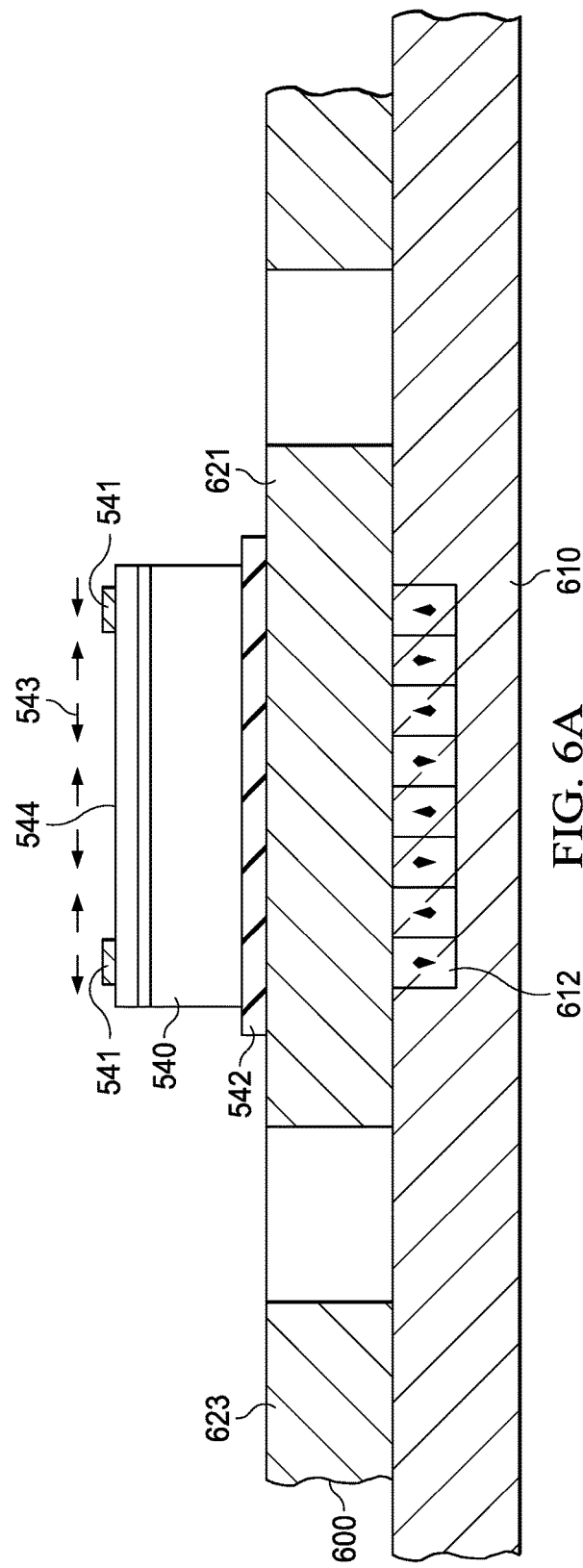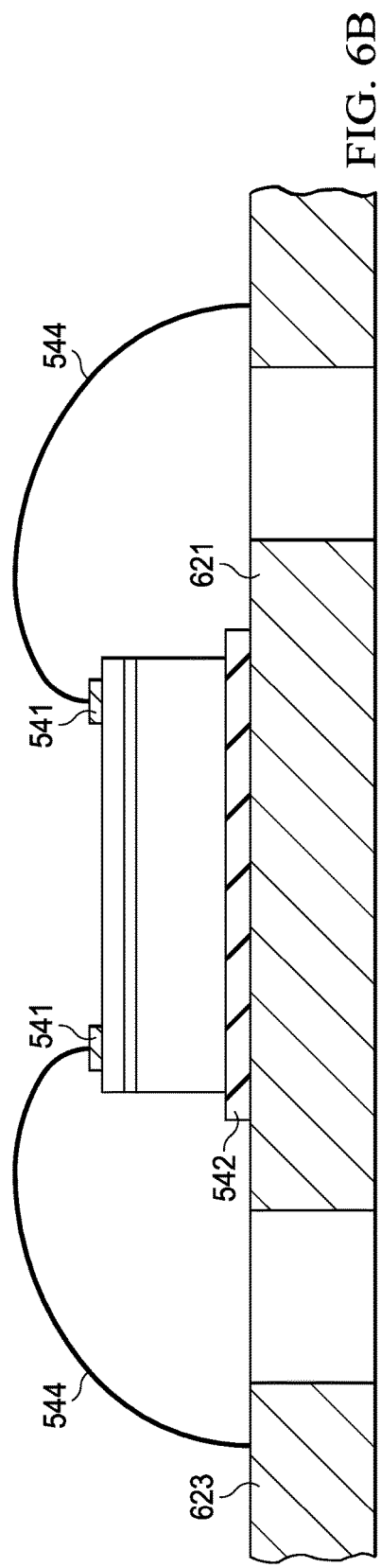

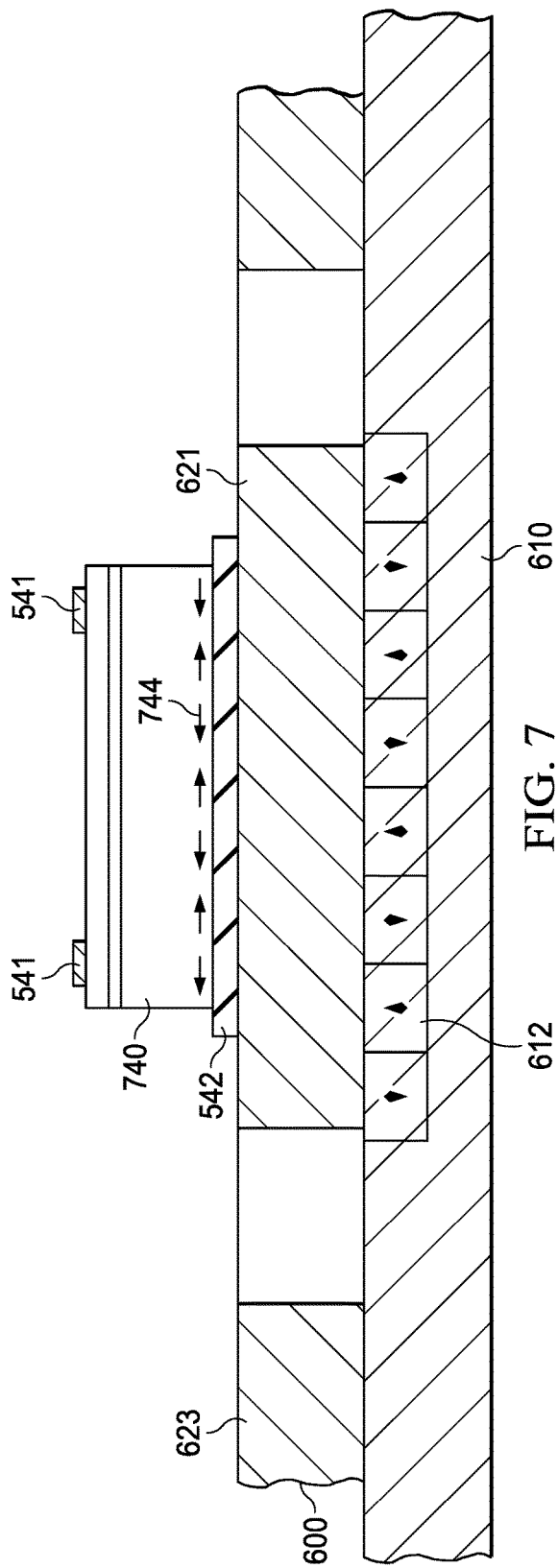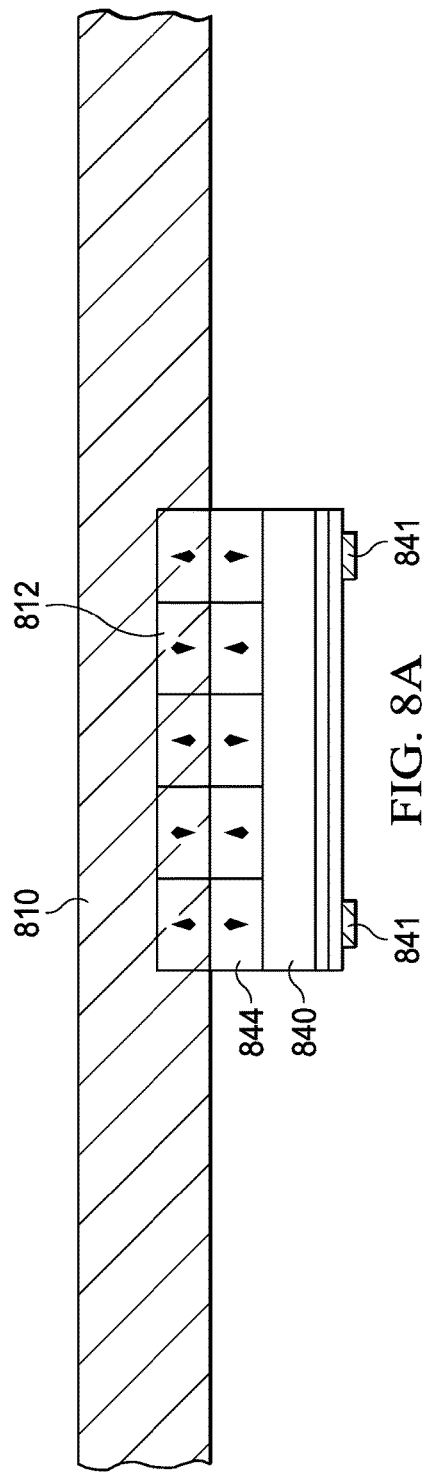

SELF-ASSEMBLY OF SEMICONDUCTOR DIE ONTO A LEADFRAME USING MAGNETIC FIELDS

FIELD OF THE DISCLOSURE

This disclosure relates to self-assembly of components, such as semiconductor die on a leadframe, using magnetic fields.

BACKGROUND OF THE DISCLOSURE

In electronics manufacturing, integrated circuit packaging is the final stage of semiconductor device fabrication, in which an individual die of semiconducting material is encapsulated in a supporting case that prevents physical damage and corrosion. The case, known as a "package," supports the electrical contacts which connect the device to a circuit board. Typically, the die is mounted on a lead frame, which may be fabricated from a metal, for example, copper, and includes a number of leads which are secured to the frame. One well known method of connecting the contact pads on the die to the lead frame is wire bonding.

Flip chip technology is a surface mount technology in which the semiconductor die is "flipped" over such that the active surface of the die faces downward to the interconnect substrate. For flip chip packaging, a leadframe may be used as the interconnect substrate to produce a plastic molded enclosure, also referred to as a "molded package." Electrical contact between the active surface of the die and the interconnect substrate is achieved by utilizing an area array of small solder "bumps" that are planted on pads on the active surface of the die. After the die is placed faced down on the interconnect substrate, the temperature is increased and the solder in the flip chip solder bumps reflows thereby bonding the die directly to the interconnect on the substrate. As such, the die makes electrical and mechanical connection directly to the interconnect substrate without the use of bond wires.

During assembly, a pick and place machine may be used to pick each individual die from a supply tray and place the die in a designated location on a lead frame strip that may hold dozens or hundreds of die. After packaging, the completed individual packages may be cut apart.

BRIEF DESCRIPTION OF THE DRAWINGS

Particular embodiments in accordance with the disclosure will now be described, by way of example only, and with reference to the accompanying drawings:

FIGS. 2A, 2B and 2C are side views of a substrate illustrating different embodiments of an array of magnetic domains;

FIGS. 5A, 5B, 6A, 6B, 7, 8A, 8B, and 8C are side views of various configurations of components being magnetically assembled on a substrate;

Figure 1:
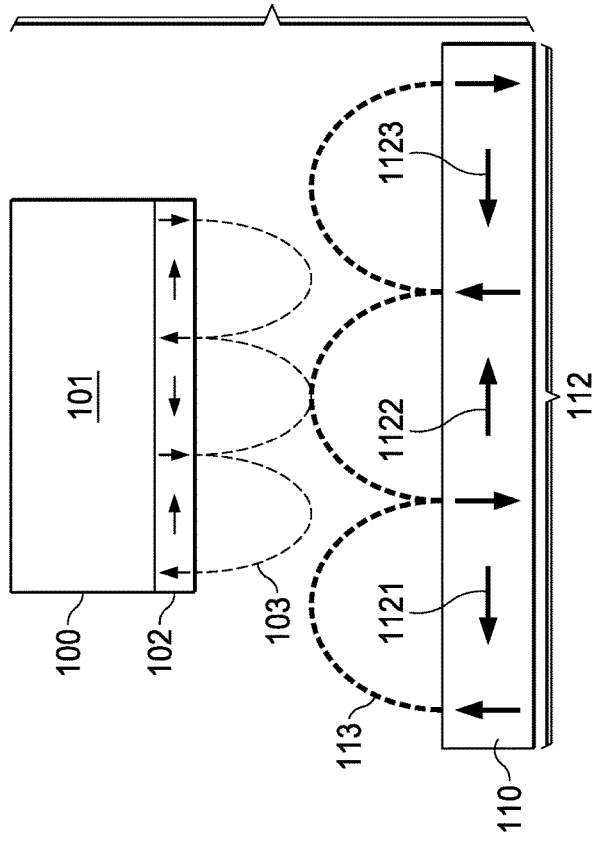
FIG. 1 is a side view of a component positioned above a substrate to illustrate interaction of magnetic fields that may be produced therein.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

In the past, die placement has been done on a pick-and-place basis where a single die is placed one at a time by a machine. This is a serial process and may be a bottle neck in the integrated circuit (IC) product manufacturing line.

Embodiments of this disclosure may address the pick and place bottle neck by using magnetic self-assembly of dies on a lead frame through the implementation of selective magnetic pole induction on the lead frame and die. The magnetic fields may be configured such that the die is self aligning and self registering. The leadframe strip may then be "submerged" in a volume of dies and through random mechanical vibrations the magnetic fields are able simultaneously co-align and register a large number of die to the lead frame in desired places.

Embodiments of magnetic self-assembly disclosed herein relies on magnetic coupling and stochastic processes, also referred to as "random processes," rather than mechanical handling and deterministic die placement. This method may be used to massively parallelize the die placement process and does not require direct placement of dies by handling machinery, as will be described in more detail below.

FIG. 1 is a side view of an example component 100 positioned above an example substrate 110 to illustrate interaction of magnetic fields that may be produced therein. In this illustration, component 100 may be an integrated circuit (IC) die, for example. Example substrate 110 may be a portion of a lead frame strip, for example.

In the case that component 100 is an IC die, it may include a body 101 that is typically silicon on which may be formed transistors that are interconnected by multiple layers of conductive interconnect material, as is well known. As will be described in more detail below, a magnetically responsive structure 102 may be formed on a top surface or bottom surface of IC die 100. Magnetically responsive structure 102 may include multiple individual magnetically responsive domains that each may produce a magnetic field, as indicated at 103.

Similarly, as will be described in more detail below, a substrate 110 may include an array of individual magnetic domains 112, such as domains 1121-1123, that each may produce a magnetic field, as indicated at 113. Various ones of the array of magnetic domains 112 may be positioned and/or activated so that component 100 is captured in a specific location due the magnetic attraction/repulsion of magnetically responsive structure 102 to the array of magnetic domains 112.

In the case that that component 100 is an IC die and substrate 110 is a leadframe, an array of magnetic domains 112 may be positioned, or activated, at each location across substrate 110 where an IC die is supposed to be positioned during the packaging process. The leadframe strip may then be "submerged" in a volume of dies and through random mechanical vibrations the magnetic fields are able simultaneously co-align and register a large number of die to the lead frame in the desired place.

Figure 2A:
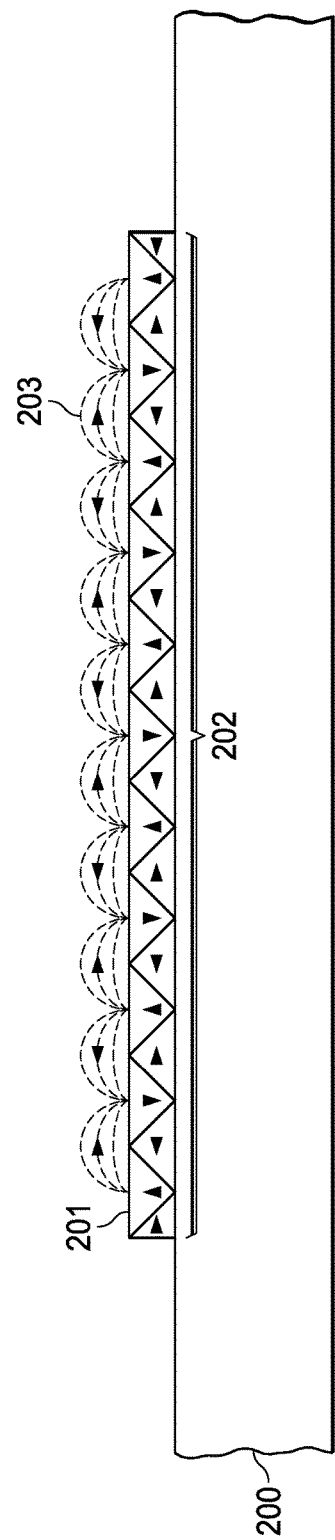

FIG. 2A is a side view of a substrate 200 illustrating an embodiment of an array of magnetic domains 202. In this example, the array of magnetic domains 202 include multiple individual domains, such as indicated at 201. The arrow included within each individual domain indicates the direction of magnetic flux produced by that individual domain. Resultant flux fields such as indicated at 203 may then be formed on the surface of substrate 200.

Each array 202 may contain several dozen, or evens several hundred, individual magnetic domains 201. Each array 202 may cover an area on a surface of substrate 200 that conforms to the foot print of the component that is intended to be positioned in a particular location. Depending on the size of the intended component and the size of the individual magnetic domains 201, the surface area size of array 202 may be the same as, larger, or smaller then the size of the intended component.

In some embodiments, array 202 may be formed in a layer that covers a large portion of substrate 200. Individual domains 201 may be "programmed" by an external force, such as an electrical or magnetic field, a laser impulse, etc, that is applied to substrate 200 in order to activate specific regions of the layer and thereby activate an array of magnetic domains in a particular position on the surface of substrate 200.

In some embodiments, substrate 200 may be reconfigured at different times by reapplying the external force in order to capture components in different locations at different times.

In some embodiments, array 202 may be formed by "printing" a magnetic material onto substrate 200 using a three dimensional (3D) additive process, for example.

In some embodiments, array of magnetic domains 202 may be embedded into substrate 200. In other embodiments, array of magnetic domains 202 may be formed on the top surface of substrate 200, or in some embodiments on the bottom surface of substrate 200. In either case, the top surface of substrate 200 will be configured to be smooth enough to allow components to move around on the surface, as will be described in more detail below.

FIG. 2B is a side view of a substrate 210 illustrating an embodiment of an array of magnetic domains 212. In this example, the array of magnetic domains 212 include multiple individual domains, such as indicated at 211. In this example, each magnetic domain is formed by an electromagnet that is activated by a wire/coil such as indicated at 214. Resultant flux fields such as indicated at 203 may then be formed on the surface of substrate 200.

Each array 212 may contain several dozen, or evens several hundred, individual magnetic domains 211. Each array 212 may cover an area on a surface of substrate 210 that conforms to the foot print of the component that is intended to be positioned in a particular location. Depending on the size of the intended component and the size of the individual magnetic domains 211, the surface area size of array 212 may be the same as, larger, or smaller then the size of the intended component.

In some embodiments, array 212 may be formed in a layer that covers a large portion of substrate 210. Individual domains 211 may be activated by a control signal applied to each wire 214 in order to activate specific regions of the layer and thereby activate an array of magnetic domains in a particular position on the surface of substrate 210. In this case, the magnetic domains may be controlled in a similar manner to pixels in an image device in which individual pixels may be turned on and off in order to form an image. The magnetic domains may be organized as "rows" and "columns" and controlled by circuitry in a similar manner as pixels in an image device, for example.

Substrate 210 may be reconfigured at different times by reapplying the control signals in order to capture components in different locations at different times, or to move components, as will be described in more detail below.

FIG. 2C is a side view of another embodiment that may use a substrate such as substrate 210 behind another layer of material 220 to form flux fields 213 that extend through layer 220 that may be used to capture components that are placed on a surface of layer 220. For example, layer 220 may be a copper leadframe strip onto which IC dies may be positioned by flux fields 213. Once the IC dies are positioned and affixed, substrate 210 may be removed. In this example, substrate 210 may be referred to as a "magnetic chuck."

Figure 3:
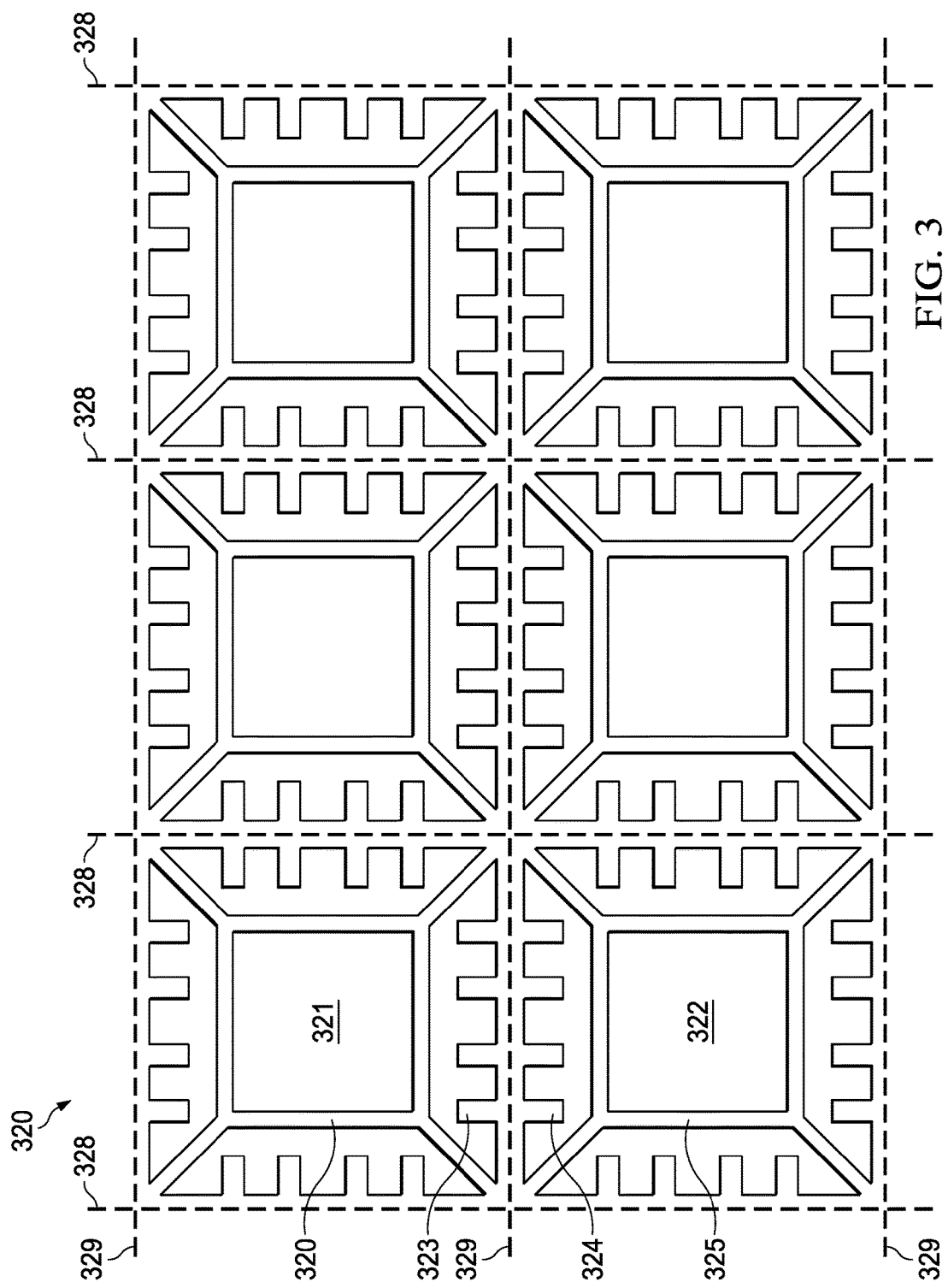
FIG. 3 is a top view of an example lead frame strip.

FIG. 3 is a top view of an example lead frame strip 320. Lead frame strip 320 may include one or more arrays of individual lead frames. Lead frame strip 320 is typically fabricated from a copper sheet that is etched or stamped to form a pattern of thermal pads and contacts. Lead frame strip 320 may be plated with tin or another metal that will prevent oxidation of the copper and provide a lower contact surface that is easy to solder. An IC die may be attached to each individual lead frame.

Each individual leadframe may include a thermal pad, such as thermal pads 321, 322. Each individual lead frame also includes a set of contacts that surround the thermal pad, such as contacts 323, 324. A sacrificial strip of metal connects all of the contacts together and provides mechanical support until a sawing process removes it. An IC die, also referred to as a "chip," is attached to each thermal pad during a packaging process. Wire bonding may then be performed to connect bond pads on each IC chip to respective contacts on the lead frame. The entire lead frame strip 320 may then be covered with a layer of mold compound to encapsulate the ICs. Lead frame strip 320 may then be singulated into individual packaged ICs by cutting along cut lines 328, 329.

Figure 4:
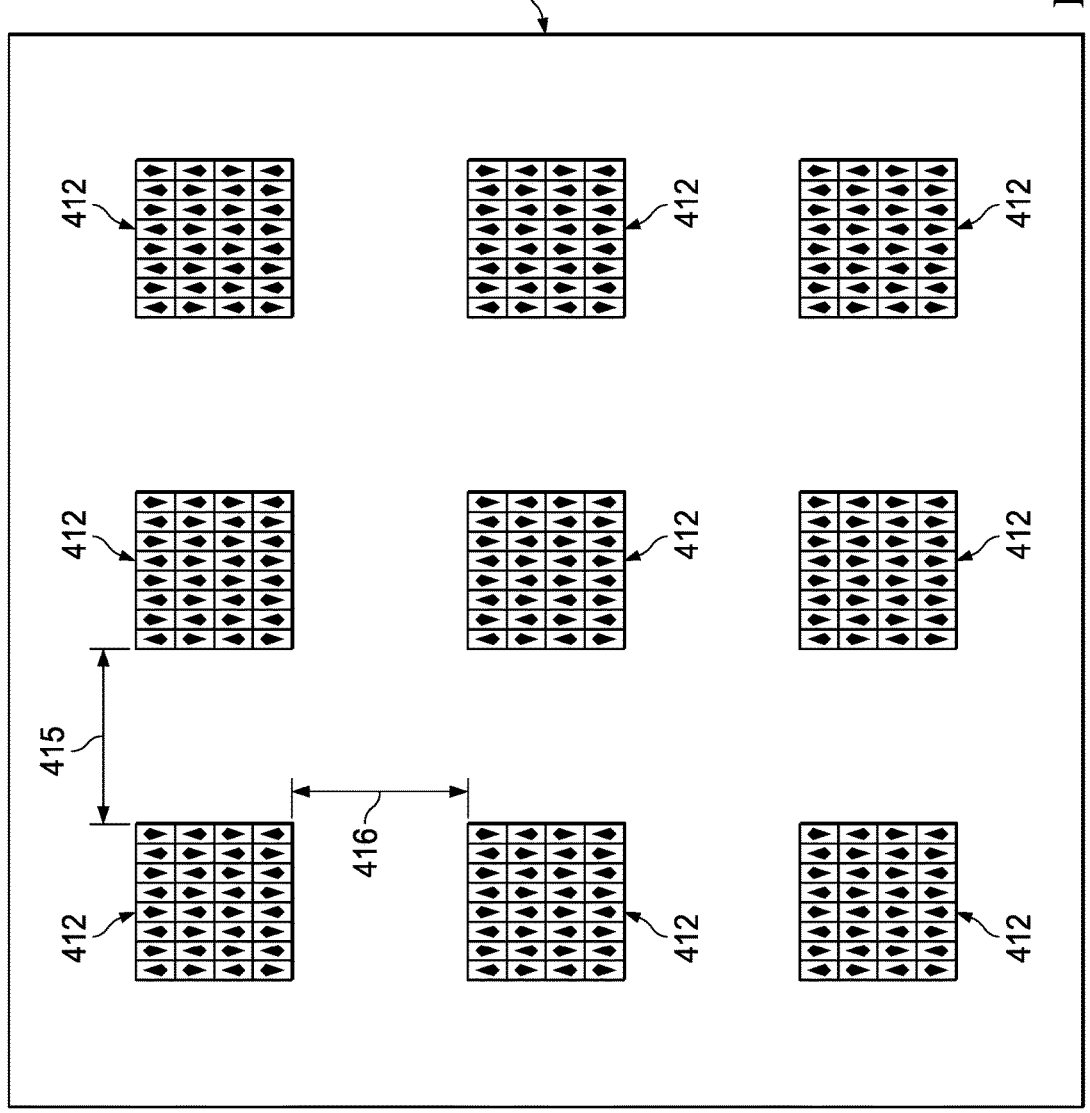
FIG. 4 is a top view of an example substrate that includes an example arrangement of arrays of magnetic domains.

FIG. 4 is a top view of an example substrate 410 that includes an example arrangement of arrays of magnetic domains 412. Substrate 410 may be constructed in a similar manner to substrate 200 as shown in FIG. 2A. In this case, each array of magnetic domains 410 may be similar to array 202 as shown in FIG. 2A. In some embodiments, an array of magnetic domains may be formed in a layer that covers a large portion of substrate 410, as indicated at 415, 416. Individual domains within each array 412 may be "programmed" by an external force, such as an electrical or magnetic field, a laser impulse, etc, that is applied to substrate 410 in order to activate specific regions of the layer and thereby activate an array of magnetic domains in a particular position on the surface of substrate 410. In some embodiments, substrate 410 may be reconfigured at different times by reapplying the external force in order to capture components in different locations at different times.

In another embodiment, substrate 410 may be constructed in a similar manner to substrate 210 as shown in FIG. 2B. In this case, each array of electromagnetic domains 410 may be similar to array 212 as shown in FIG. 2B. In some embodiments, an array of electromagnetic domains may be formed in a layer that covers a large portion of substrate 410, as indicated at 415, 416. Individual domains within each array 412 may be activated by a control signal applied to each electromagnet, such as each wire 214 in FIG. 2B, in order to activate specific regions of the layer and thereby activate an array of magnetic domains in a particular position on the surface of substrate 410. In this case, the magnetic domains may be controlled in a similar manner to pixels in an image device in which individual pixels may be turned on and off in order to form an image. The magnetic domains may be organized as "rows" and "columns" and controlled by circuitry in a similar manner as pixels in an image device, for example.

In some embodiments, substrate 410 may be used to position IC dies on a leadframe for packaging. In this case, in some embodiments substrate 410 may be the leadframe strip, as illustrated in FIG. 3, in which each array of magnetic domains 412 may correspond to a thermal pad such as 321, 322. In other embodiments, substrate 410 may be positioned adjacent a leadframe during the assembly process, as illustrated in FIG. 2C. The various arrays of magnetic domains 412 may be arranged to correspond to the placement of dies on the leadframe, for example.

FIGS. 5A and 5B illustrate a side view of an example configuration of a component 540 being magnetically assembled onto a substrate 500. In this example, component 540 may be an IC die and substrate 500 may be a leadframe, for example. In this example, substrate 500 may be similar to substrate 200 as shown in FIG. 2A. As described in more detail with regards to FIG. 2A, an array of magnetic domains 502 may be formed on substrate 500 at a location where IC die 540 is to be placed. In this example, IC die 540 is positioned on thermal pad 521 that is part of leadframe 500.

IC die 540 may include an epitaxial (epi) layer in which is formed various semiconductor devices. These semiconductor devices may be interconnect by conductive traces that may be formed in one or more layers of conductive material formed over the epi layer. One or more of these conductive layers may include metallic material that may have magnetic properties. For example, in this example, top interconnect layer 544 may include copper, nickel and palladium, for example. In this manner, a magnetically responsive structure may be an inherent part of IC device 540.

In another embodiment, a magnetically responsive structure may be formed on a top surface or on a bottom surface of IC die 540. In some embodiments, a magnetically responsive structure may be printed on the top surface or on the bottom surface of IC die 540 using a 3D additive process, for example.

In another embodiment, a magnetically responsive structure on the surface of IC die 540 may include a conductive loop that may be selectively powered by an external energy source. For example, IC die 540 may include a structure to receive energy in a near field communication (NFC) mode of operation that may then be used to activate the conductive loop to form an electromagnet. Alternatively, a radio frequency identification (RFID) structure may be implemented on IC die 540 to receive energy in a near field RFID mode of operation that may then be used to activate the conductive loop to form an electromagnet.

In this example, only a single IC 540 is illustrated for clarity; however, leadframe 500 may have locations for hundreds of IC die, for example, that may all be positioned simultaneously. As will be described in more detail below, multiple IC die 540 may be placed on the surface of leadframe 500 in a random manner. Leadframe 500 may then be shaken or vibrated, for example, to agitate the multiple IC die. Individual IC die 540 may then be captured in specific locations on the surface of leadframe 500 by magnetic attraction between the array of magnetic domains 502 at each specific location and the magnetically responsive structure on each IC die 540.

Once the IC die are properly positioned, they may be affixed to that location, as illustrated in FIG. 5B. In some embodiments, an adhesive 542 may be used to affix IC 540 to leadframe 500. For example, adhesive 542 may be a B-stage epoxy film that is applied to the surface of leadframe 500, patterned, and etched using known or later developed IC fabrication techniques to form an adhesive pad on each thermal pad of leadframe 500. While the multiple IC die are being agitated, the B-stage epoxy pad 542 may be in a partially cured state that is not sticky. B-stage epoxy pad 542 may be relatively thin and therefore does not impede the movement of IC die 540 while it is being positioned. Once the IC die are properly positioned, the entire leadframe and IC die may be heated to activate the B-stage epoxy and thereby permanently affix the IC die 540 to the leadframe 500.

In another embodiment, the magnetic attraction between the array of magnetic domains 502 and the magnetically responsive structure in IC die 540 may be sufficient to affix the IC die in position for further processing without the need for an adhesive.

Further processing may then be performed to package the IC die. For example, wire bonds 544 may be installed between bond pads 541 on the IC die 540 and contacts 523 on leadframe 500. The entire assembly may then be encapsulated and sawn into individual packaged ICs.

FIGS. 6A and 6B illustrate a side view of an example configuration of a component 540 being magnetically assembled onto a substrate 600. In this example, component 540 may be an IC die and substrate 600 may be a leadframe, for example. A second substrate 610 may be positioned adjacent substrate 600. In this example, substrate 610 may be similar to substrate 210 as shown in FIG. 2B. As described in more detail with regards to FIG. 2B, an array of magnetic domains 612 may be formed on substrate 610 at a location where IC die 540 is to be placed. In this example, IC die 540 is positioned on heat dissipation pad 621 that is part of leadframe 600.

In some embodiments, array 612 may be formed in a layer that covers a large portion of substrate 610. Individual domains may be activated by a control signal applied to an electromagnet in each magnetic domain in order to activate specific regions of the layer and thereby activate an array of magnetic domains in a particular position on the surface of substrate 610. In this case, the magnetic domains may be controlled in a similar manner to pixels in an image device in which individual pixels may be turned on and off in order to form an image. The magnetic domains may be organized as "rows" and "columns" and may be controlled by circuitry in a similar manner as pixels in an image device, for example.

As described above, IC die 540 may include an epitaxial (epi) layer in which is formed various semiconductor devices. These semiconductor devices may be interconnect by conductive traces that may be formed in one or more layers of conductive material formed over the epi layer. One or more of these conductive layers may include metallic material that may have magnetic properties. For example, in this example, top interconnect layer 544 may include copper, nickel and palladium, for example. In this manner, a magnetically responsive structure may be an inherent part of IC device 540. In another embodiment, a magnetically responsive structure may be formed on a top surface or on a bottom surface of IC die 540. In some embodiments, a magnetically responsive structure may be printed on the top surface or on the bottom surface of IC die 540 using a 3D additive process, for example.

In this example, only a single IC 540 is illustrated for clarity; however, leadframe 600 may have locations for hundreds of IC die, for example, that may all be positioned simultaneously. As will be described in more detail below, multiple IC die 540 may be placed on the surface of leadframe 600 in a random manner. Leadframe 600 and substrate 610 together may then be shaken or vibrated, for example, to agitate the multiple IC die. Individual IC die 540 may then be captured in specific locations on the surface of leadframe 600 by magnetic attraction between the array of magnetic domains 612 at each specific location and the magnetically responsive structure on each IC die 540.

As described above, once the IC die are properly positioned, they may be affixed to that location, as illustrated in FIG. 6B. In some embodiments, an adhesive 542 may be used to affix IC 540 to leadframe 600. Once the IC die are properly positioned, the entire leadframe and IC die may be heated to activate the B-stage epoxy and thereby permanently affix the IC die 540 to the leadframe 600.

Further processing may then be performed to package the IC die. For example, wire bonds 544 may be installed between bond pads 541 on the IC die 540 and contacts 623 on leadframe 600. The entire assembly may then be encapsulated and sawn into individual packaged ICs.

FIG. 7 illustrates a side view of an example configuration of a component 740 being magnetically assembled onto a substrate 600. This example is similar to the example of FIG. 6A. In this example, component 740 may have a magnetically responsive structure 744 formed on the back side of die 740 opposite from bond pads 541. In some embodiments, a magnetically responsive structure may be printed on the top surface or on the bottom surface of IC die 740 using a 3D additive process, for example.

Figure 8B:
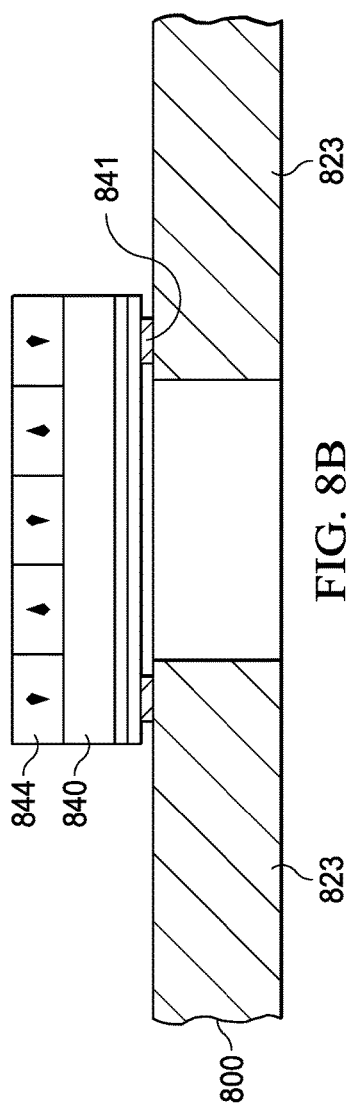

FIGS. 8A and 8B illustrate a side view of an example configuration of a component 840 being magnetically assembled onto a substrate 800. In this example, component 840 may be an IC die and substrate 800 may be a leadframe, for example.

A second substrate 810 may be used as a magnetic chuck. In this example, substrate 810 may be similar to substrate 210 as shown in FIG. 2B. As described in more detail with regards to FIG. 2B, an array of magnetic domains 812 may be formed on substrate 810 at a location where IC die 840 is to be placed.

In some embodiments, array 812 may be formed in a layer that covers a large portion of substrate 810. Individual domains may be activated by a control signal applied to an electromagnet in each magnetic domain in order to activate specific regions of the layer and thereby activate an array of magnetic domains in a particular position on the surface of substrate 810. In this case, the magnetic domains may be controlled in a similar manner to pixels in an image device in which individual pixels may be turned on and off in order to form an image. The magnetic domains may be organized as "rows" and "columns" and may be controlled by circuitry in a similar manner as pixels in an image device, for example.

In this example, component 840 may have a magnetically responsive structure 844 formed on the back side of die 840 opposite from bond pads 841. In some embodiments, a magnetically responsive structure may be printed on the top surface or on the bottom surface of IC die 840 using a 3D additive process, for example.

In this example, a set of IC die 840 may be first captured at designated locations using electromagnetic arrays 812 in a similar manner as described above. However, in this case, the IC die 840 are positioned with their bond pads 841 facing away from magnetic chuck 810. After the IC die 840 are captured by magnetic chuck 810, magnetic chuck 810 may be inverted so that the IC die 840 are suspended, as illustrated in FIG. 8A.

In this example, only a single IC 840 is illustrated for clarity; however, leadframe 800 may have locations for hundreds of IC die, for example, that may all be positioned simultaneously. As will be described in more detail below, multiple IC die 840 may be placed on the surface of magnetic chuck 810 in a random manner. Magnetic chuck 810 may then be shaken or vibrated, for example, to agitate the multiple IC die. Individual IC die 840 may then be captured in specific locations on the surface of magnetic chuck 810 by magnetic attraction between the array of magnetic domains 812 at each specific location and the magnetically responsive structure on each IC die 840.

Magnetic chuck 810 may then lower the IC die 840 onto leadframe 800 where they may be further assembled as "flip chips," as illustrated in FIG. 8B. In this example, bond pads 841 may be coated with solder or other material that may be used to provide a conductive connection between bond pads 841 and leadframe contacts 823.

In this example, magnetic domains 812 are formed by electromagnets that may be deactivated after the IC dies 840 are positioned on leadframe 800. In another embodiment, magnet chuck 810 may use permanent magnetic domains. In this case, the magnetic chuck may remain in place until the IC dies are affixed to the leadframe. The magnetic chuck may then be slid laterally to release it from the IC die, for example.

Figure 8C:
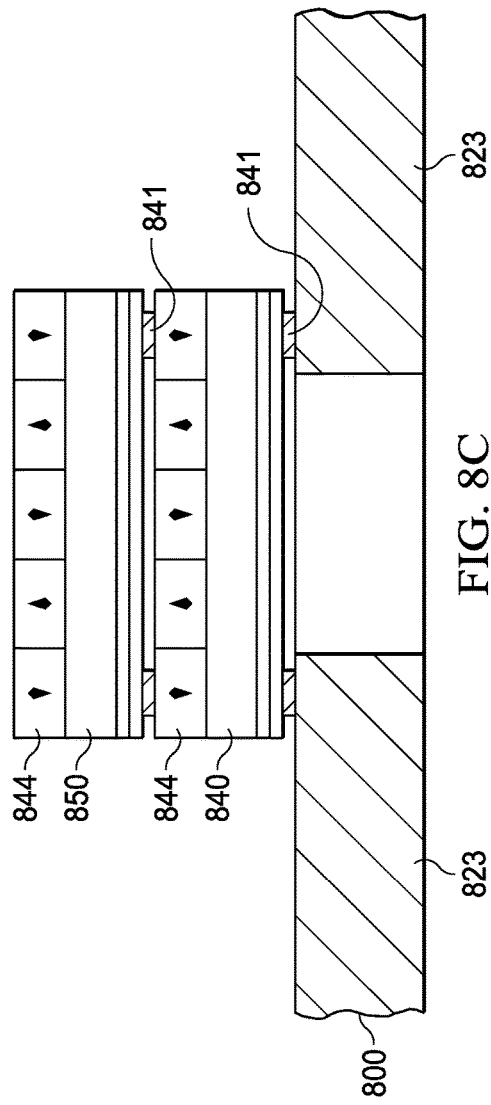

FIG. 8C is a side view illustrating another embodiment in which a second IC die 850 is positioned on top of IC die 840 in a multichip module (MCM) configuration. In this case, IC die 840 may be positioned with magnetic chuck 810 and then captured on substrate 800, as described above. Magnetic chuck 810 may then be exposed to another set of die to capture and place them in the same manner as described above.

Referring back to FIG. 5A, 6A, or 7, for example, an MCM may be created by first flooding a substrate with a first type of chips, agitating them and capturing them as described above, then flooding the substrate with a second type of chips, agitating them and capturing them in a stacked MCM configuration.

Figure 9:
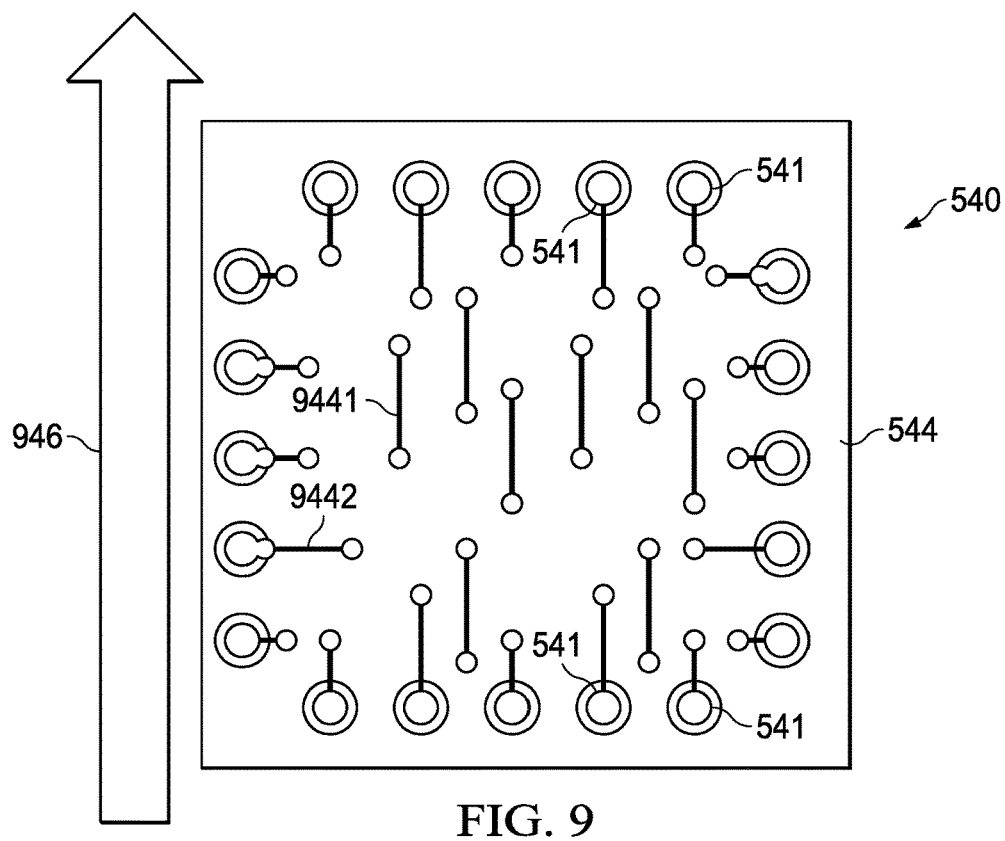
FIGS. 9 and 10 are illustrations of magnet domains that may be inherently formed in an interconnect layer of an integrated circuit.

FIG. 9 is an illustration of magnet domains that may be inherently formed in an interconnect layer of an integrated circuit, such as IC die 540 as illustrated in FIG. 5A. IC die 540 may include an epitaxial (epi) layer in which is formed various semiconductor devices. These semiconductor devices may be interconnect by conductive traces that may be formed in one or more layers of conductive material formed over the epi layer. One or more of these conductive layers may include metallic material that may have magnetic properties. For example, in this example, top interconnect layer 544 may include copper, nickel and palladium, for example. Palladium has paramagnetic properties, which means it may be attracted to a magnetic flux field, but does not retain any permanent magnetism. In this manner, a magnetically responsive structure may be an inherent part of IC device 540.

Figure 10:
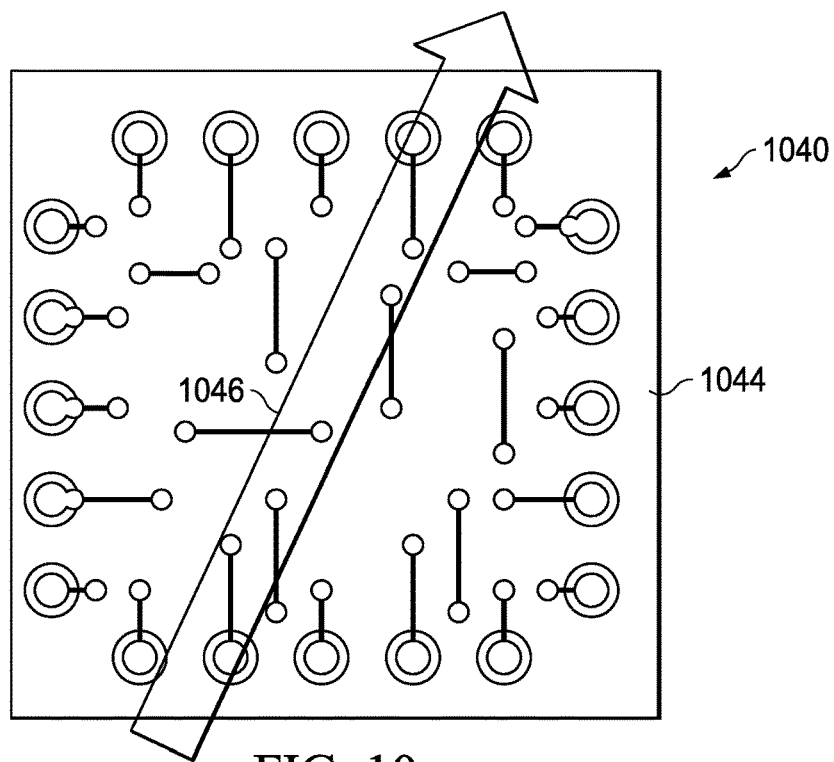

The various conductive traces in interconnect layer 544 may have different orientations, such as vertical traces such as trace 9441 and horizontal traces such as trace 9442. Depending on the overall topology of interconnect layer 944, there may be a dominant magnetic response direction. In this example, magnetic response direction 946 is approximately parallel to vertical trace 9441. FIG. 10 illustrates an example IC die 1040 that has a different topology in interconnect layer 1044. In this example, the dominant magnetic response orientation 1046 may be skewed approximately 30 degrees from vertical, for example.

Figure 11:
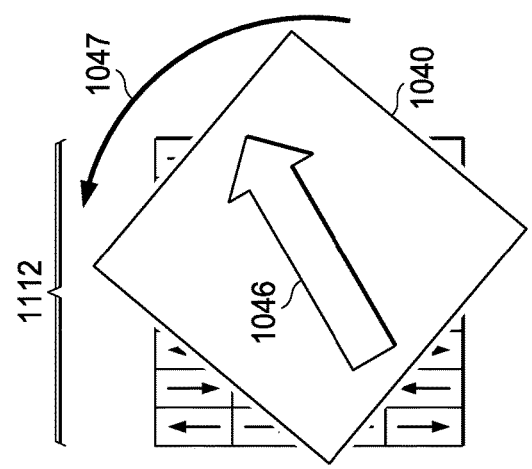
FIG. 11 is an illustration of a calibration process that may be performed on a component.

FIG. 11 is an illustration of a calibration process that may be performed on a component, such as component 1040, in order to determine a dominant magnetic response of the component. Each type of IC die may be calibrated to determine the shape and/or orientation of a magnetic response produced by a magnetically responsive structure that is part of the IC die. In a similar manner, other types of components that may have an inherent or an explicitly added magnetically responsive structure may be calibrated to determine the dominant magnet response of the component.

Based on the calibrated dominant magnet response orientation of a particular component, the array of magnetic domains in a substrate such as substrate 200 as shown in FIG. 2A or substrate 212 as shown in FIG. 2B may be configured or controlled to produce a magnetic field that is aligned with the dominant magnetic response of the component so that the component is positioned correctly on the substrate in response to the magnet field produced by the array of magnetic domains in the substrate.

As illustrated in FIG. 11, the strength of various magnetic domains in array 1112 may be adjusted to cause a component, such as component 1040 as shown in FIG. 10 for example, that is being calibrated to rotate as indicated at 1047 until it is positioned in a desired orientation. Array 1112 may be located on a test substrate. Alternatively, array 1112 may be part of a chuck, such as chuck 810 as shown in FIG. 8A. Alternatively, array 1112 may be a part of a substrate 210 as shown in FIG. 2B, for example.

Figure 12:
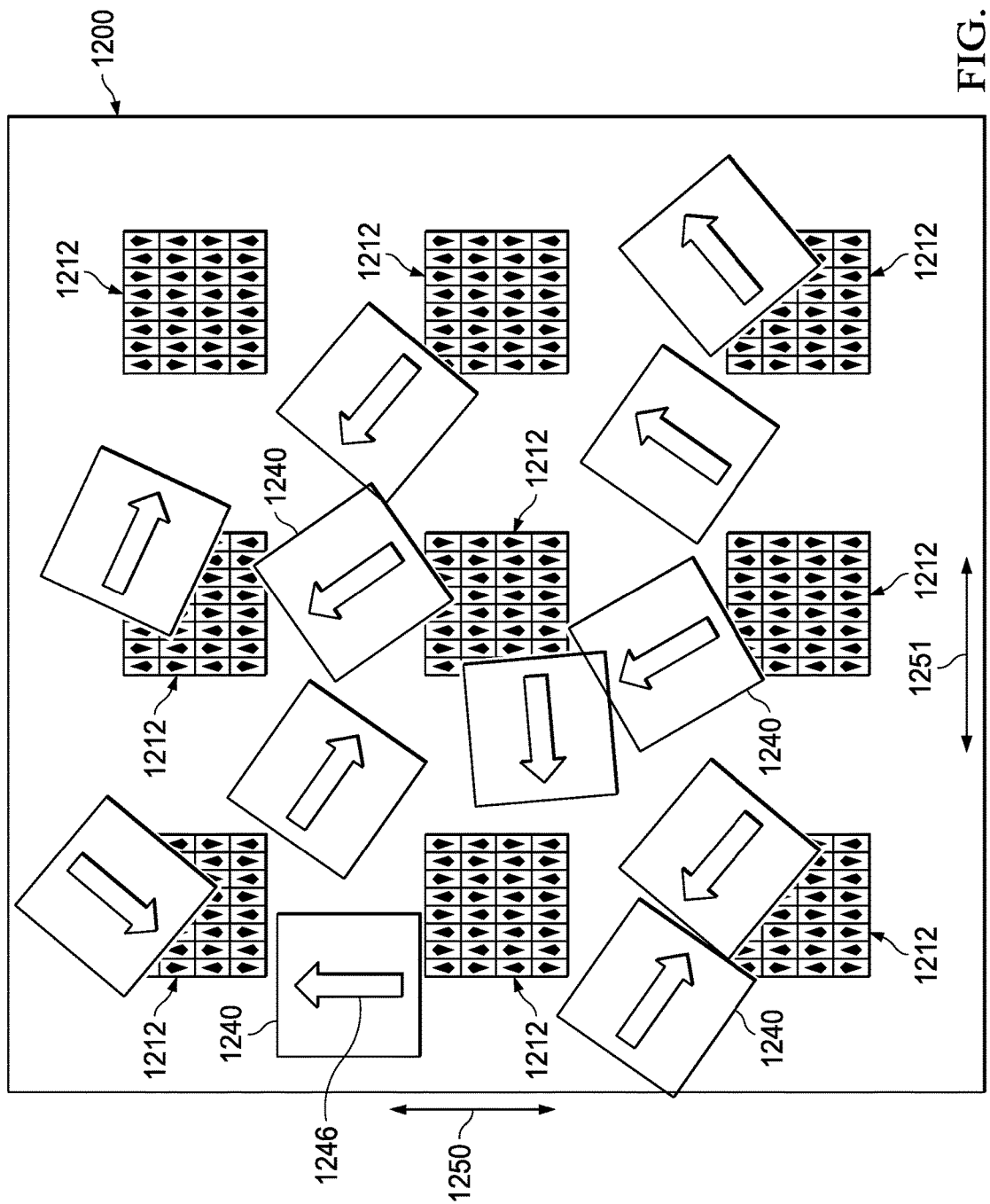
FIGS. 12-15 are illustrations of magnetically orienting and capturing a group of components.
Figure 13:
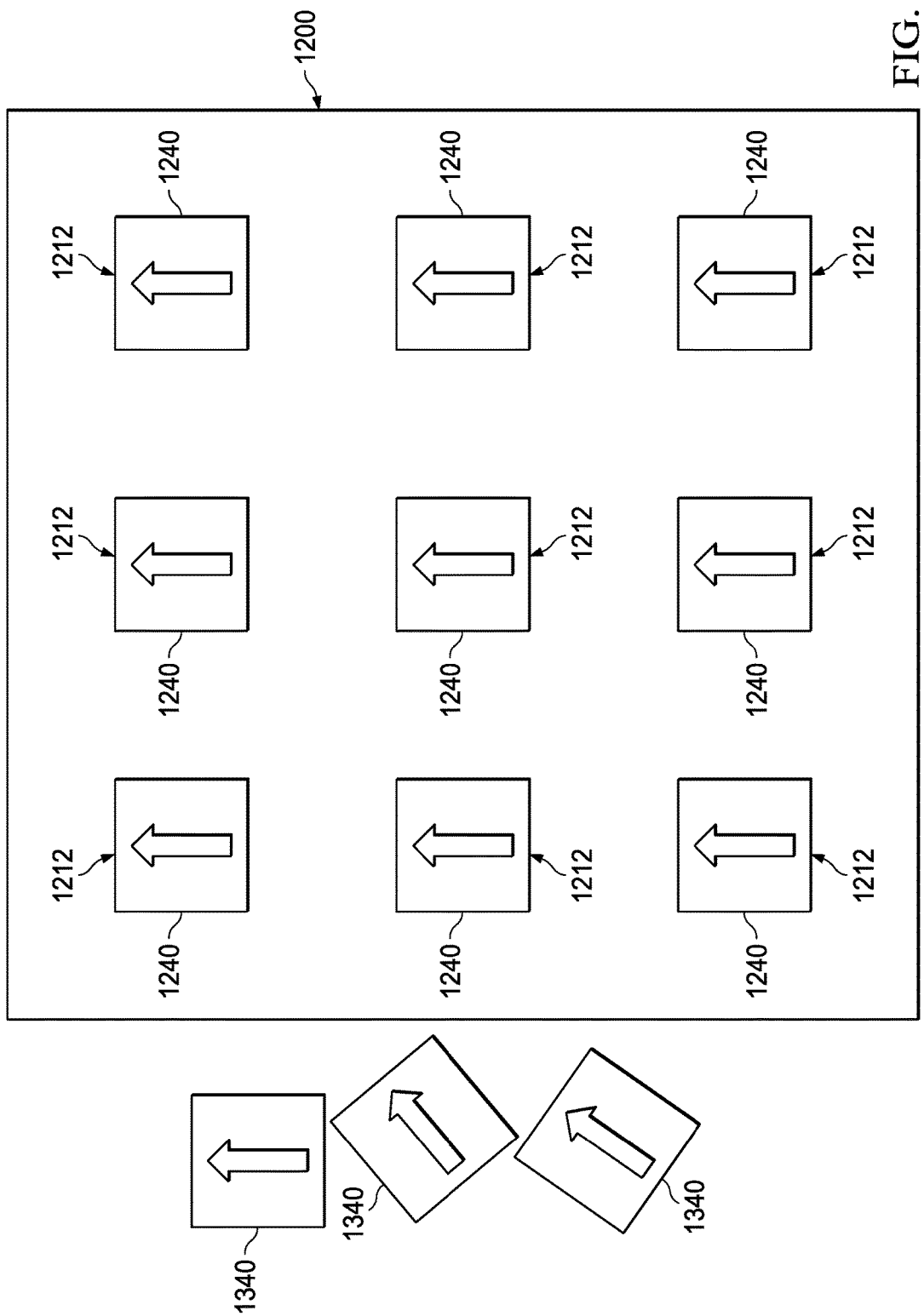
Figure 14:
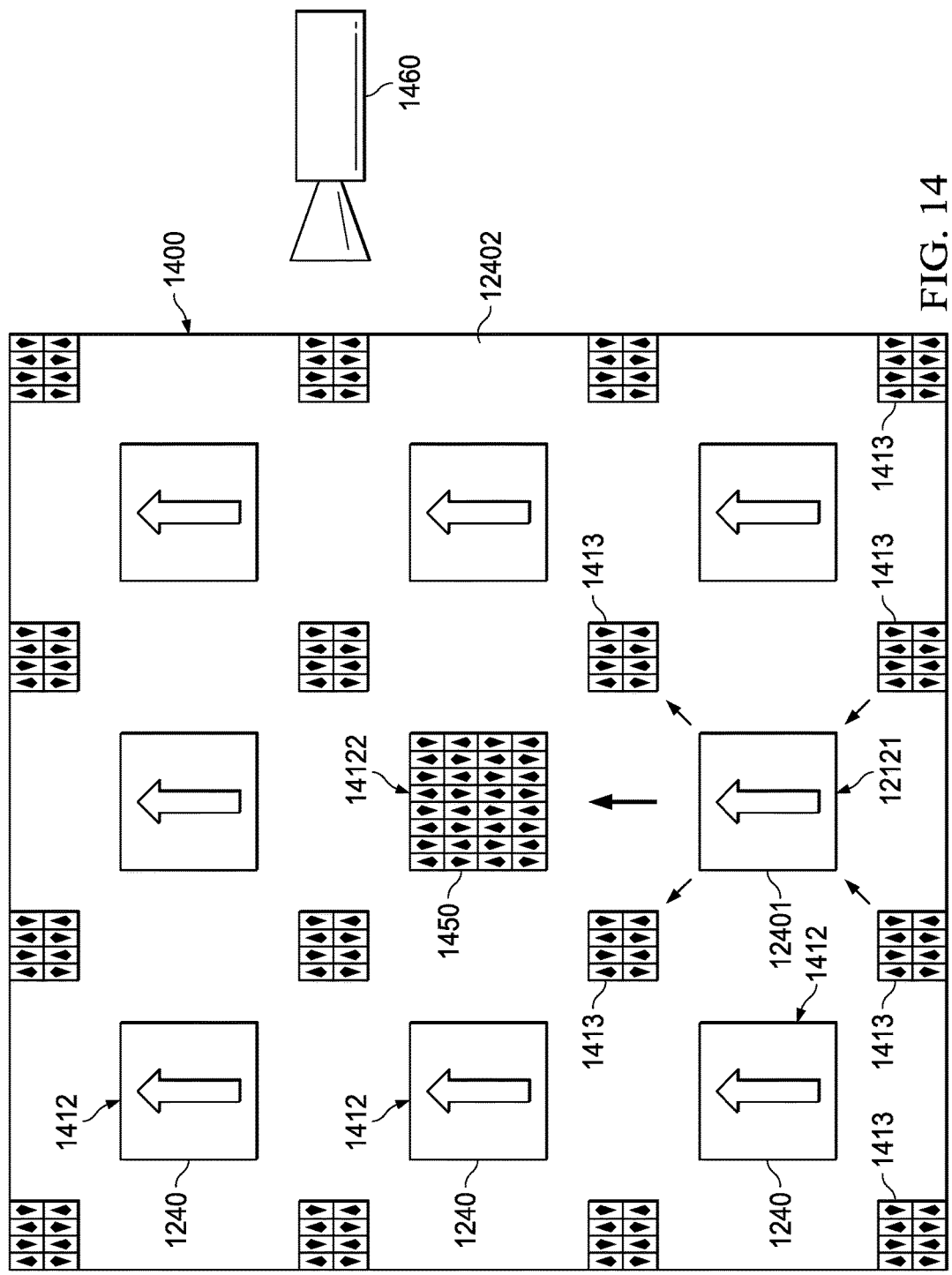

FIGS. 12-14 are illustrations of magnetically orienting and capturing a group of components 1240 on a substrate 1200. In this example, substrate 1200 is representative of any of the substrates described above, such as substrate 200, 210, 410, leadframe 500, substrate 610 overlaid by leadframe 600, and chuck 810.

In this example, nine arrays of magnetic domains 1212 are illustrated for simplicity. It is to be understood that a typically embodiment may include several tens or hundreds of arrays of magnetic domains 1212. Each array of magnetic domains 1212 is representative of an array of permanent magnets such as array 202 shown in FIG. 2A or an array of electromagnets such as array 212 shown in FIG. 2B.

In this example, components 1240 are representative of any of the components described above in more detail, such as component 540 as shown in FIG. 5A, component 740 as shown in FIG. 7, component 840 as shown in FIG. 8A, or other components that include a magnetically responsive magnetic structure. In this example, the dominant magnetic response orientation of component 1240 is approximately perpendicular to one side of component 1240, as illustrated at 1246. As described above with regard to FIGS. 11 and 12, other components may have a dominant magnetic response that is oriented differently than component 1240. In that case, the magnetic field produced by each array of magnetic domains 1212 may be adjusted accordingly so that when the component is captured by an array of magnetic domains 1212 it will be oriented properly.

Initially, a large number of components 1240 may be placed on a surface of substrate 1200. This may be done in many ways, such as by "submerging" substrate 1200 in a container holding components 1240, or by simply dumping a batch of components on substrate 1200, for example. In any case, the components 1240 may initially have a random arrangement as illustrated in FIG. 12.

Substrate 1200 may then be agitated as illustrated at 1250, 1251 with enough force so that components 1240 are encouraged to move around on the surface of substrate 1200 but not with too much force that prevents each array of magnetic domains 1212 from capturing one of the components 1240 using only magnetic attraction between the array of magnetic domains 1212 and the magnetic response of each component 1240.

FIG. 13 illustrates substrate 1200 after a period of time in which one component 1240 has been captured by each array of magnetic domains 1212 in a specific location determined by each array of magnetic domains 1212. After all of the available locations are filled, excess components may be removed from substrate 1200, as indicated by removed components 1340. Components may be removed by further agitation of substrate 1200, by tipping substrate 1200, etc.

FIG. 14 illustrates another aspect of magnetic self-assembly. In this example, a position indicated at 1450 has inadvertently been left open after the process of agitation, as described with regard to FIGS. 12 and 13. A visual inspection system indicated at 1460 may be used to detect such omissions. Visual inspections systems are well known and need not be described in detail herein.

In this example, substrate 1400 may be the same or similar to substrate 1200 as shown in FIGS. 12 and 13. In this case, under direction from visual inspection system 1460, the array of magnetic domains 14121 that are holding component 12401 may be deactivated to thereby allow component 12401 to move towards array of magnetic domains 14122 in response to substrate 1400 being agitated. Visual inspection system 1460 may monitor the movement of component 12401 and reactivate the array of magnetic domains 14121 so that it may then capture component 12402 to thereby fill all of the locations.

In some embodiments, substrate 1400 may include additional arrays of magnetic domains such as those indicated at 1413. In this case, various ones of arrays 1413 may be activated under direction of visual inspection system 1460 to encourage component 12401 to move towards location 1450.

In some embodiments, the surface of substrate 1400 may be substantially covered with a large array of magnetic domains. In this case, a component such as component 12401 may be moved along a path from array 14121 to array 14122 by sequentially activating various small sets of magnetic domains along a path between array 14121 and array 14122. Similarly, a component 12402 may be moved along a path from its current position to array 14121 by sequentially activating various small sets of magnetic domains along a path towards array 14121. In this case, components may be moved without needing to agitate substrate 1400.

Figure 15:
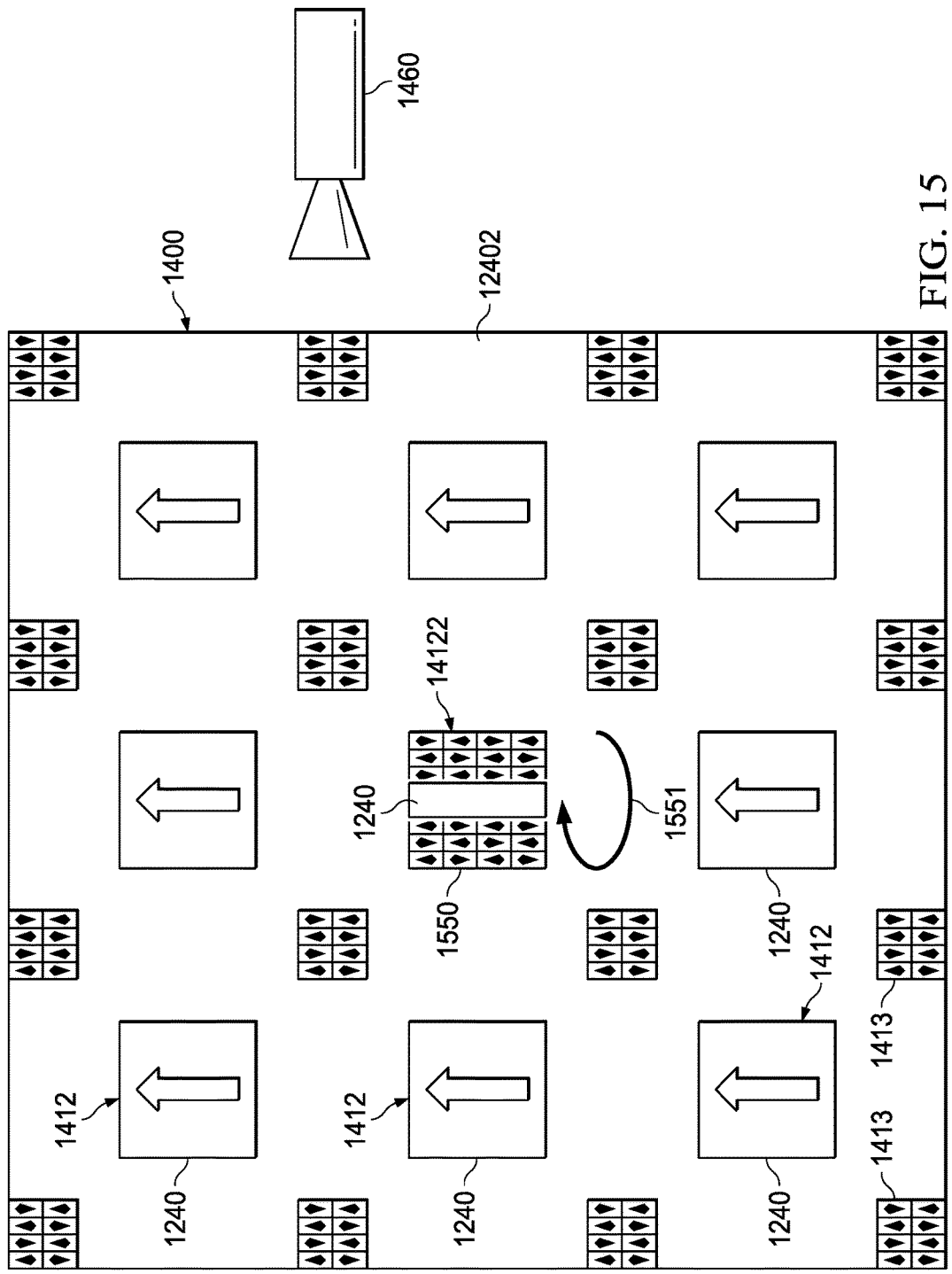

FIG. 15 illustrates a situation where one of the components 1240 is upside down at location 1550. Visual inspection system 1460 may detect that component 1240 at location 1550 is upside down. Array of magnetic domains 14122 may be manipulated by turning on certain domains and turning off other domains so that a magnetic field is formed that repels one side of component 1240 at location 1550 in order to cause that component 1240 to stand up on edge as indicated at 1551, which may be monitored by visual inspection system 1460. Array of magnetic domains 14122 may then be manipulated to turn on a different set of domains to cause component 1240 at location 1550 to lie down in a correct position. In this manner, one or more components 1240 may be flipped over to lie in a correct orientation. While two steps are suggested here, more than two manipulations of array of magnetic domains 14122 may be required to cause component 1240 to flip over.

Figure 16:
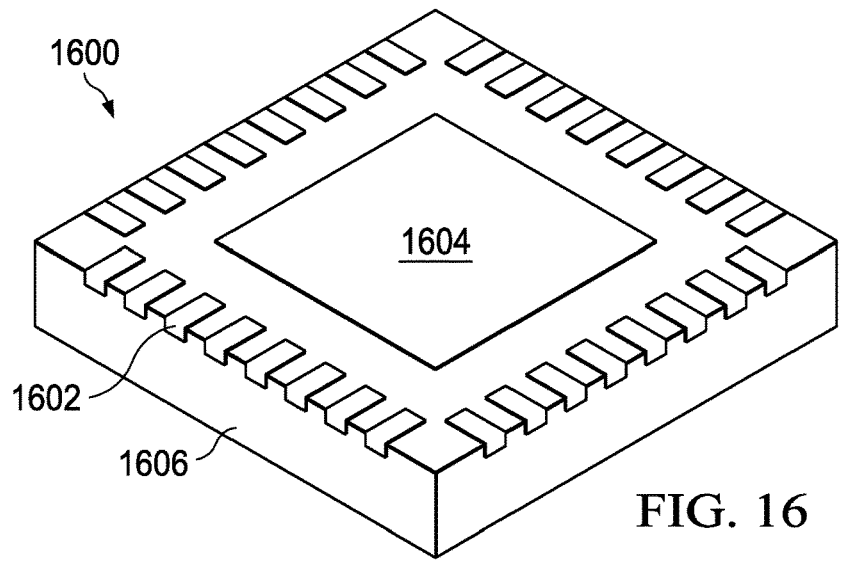
FIG. 16 is an illustration of an IC package in which the semiconductor die was magnetically oriented onto the leadframe during packaging.

FIG. 16 is an illustration of a quad-flat no-leads (QFN) IC package 1600 that was assembled using magnetic self-assembly as described herein. In this figure, the bottom side of QFN package 1600 is illustrated. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of PCBs without through-holes. Flat no-lead is a near chip scale plastic encapsulation package made with a planar copper lead frame substrate. Perimeter lands on the package bottom provide electrical connections to the PCB. Flat no-lead packages include an exposed thermal pad to improve heat transfer out of the IC (into the PCB). Heat transfer can be further facilitated by metal vias in the thermal pad. The QFN package is similar to the quad-flat package, and a ball grid array.

QFN package 1600 includes a set of contacts 1602 arrayed around the perimeter of the package on the bottom side. Thermal pad 1604 has an exposed surface on the bottom side of QFN 1600. An integrated circuit die (not shown) is mounted to the other side of thermal pad 1604. The entire assembly is encapsulated in a molding compound 1606, such as various types of epoxy compounds, for example. While a QFN is illustrated in FIG. 16, other embodiments may use other types of integrated circuit packages.

Figure 17:
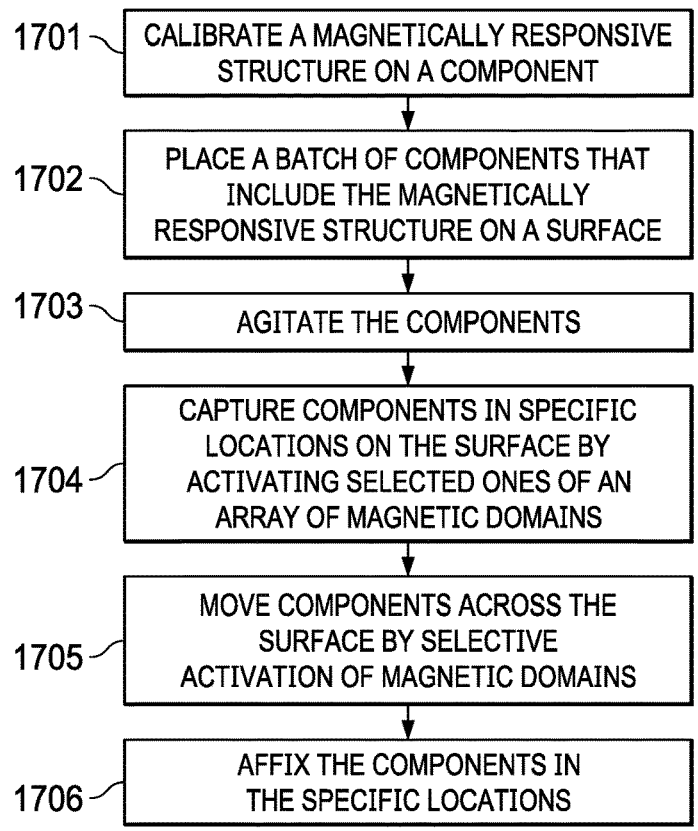
FIG. 17 is a flow diagram illustrating magnetic self-assembly of semiconductor die onto a leadframe using magnetic fields.

FIG. 17 is a flow diagram illustrating magnetic self-assembly of semiconductor die onto a leadframe using magnetic fields as described in more detail above. A calibration process may be performed as described in more detail with regard to FIG. 11 to determine the relative orientation of a dominant magnetic response of a magnetically responsive structure within a component as indicated at box 1701. Once the orientation of the dominant magnetic response of the component is known, this information may be used to configure an array of magnetic domains to capture a similar component in a specific orientation.

A batch of components that include a magnetically responsive structure may be placed on a surface that includes an array of magnetic domains as indicated at box 1702. In some embodiments, the surface may be part of a substrate in which the magnetic domains are formed, such as substrate 200 as shown in FIG. 2A. In another embodiment, the surface may be part of an overlay that is positioned adjacent to substrate that included the array of magnetic domains, such as surface 220 as shown in FIG. 2C. This may be done in many ways, such as by "submerging" a substrate that has the surface in a container holding a batch of components, or by simply dumping a batch of components on the substrate, for example. In any case, the components may initially have a random arrangement as illustrated in FIG. 12.

The substrate may then be agitated as indicated at box 1703 as illustrated at 1250, 1251 in FIG. 12 with enough force so that the batch of components are encouraged to move around on the surface of the substrate but not with too much force that prevents portions of the magnetic domain from capturing the components in specific locations as indicated at box 1704 using only magnetic attraction between the magnetic domains and the magnetic response of each component.

Selected ones of the array of magnetic domains may be activated to capture components at specified locations. In the case the magnetic domains are electromagnets, they may be activated by a control signal applied to each wire in order to activate specific domains and thereby activate an array of magnetic domains in a particular position on the surface of the substrate. In this case, the magnetic domains may be controlled in a similar manner to pixels in an image device in which individual pixels may be turned on and off in order to form an image. The magnetic domains may be organized as "rows" and "columns" and controlled by circuitry in a similar manner as pixels in an image device, for example.

In the case that the magnet domains are permanent magnets, they may be initialized by applying an external force to form selected field polarities. Depending on the material that forms the magnetic domains, the external force may be a directed magnetic field, a directed electric field, heat, energy from a laser, etc.

In some embodiments, components may be moved across the surface by selective activation of magnetic domains as indicated at box 1705 and described in more detail with regard to FIGS. 14 and 15. A visual inspection system may be used to determine which components need to be moved and/or flipped and to control the movement, for example.

In some embodiments, the surface may be magnetic chuck that is used to capture the components in specified locations. Once captured, the components may be transferred to a second surface, as describe in more detail with regard to FIGS. 8A-8B.

Once the components are correctly positioned in specified locations, they may be permanently or semi permanently affixed there as indicated at box 1706. In some embodiments, an adhesive may be used to affix a component. For example, an adhesive may be a B-stage epoxy film that is applied to the surface, patterned, and etched using known or later developed fabrication techniques to form an adhesive pad at each specific location of the surface. While the batch of components is being agitated, the B-stage epoxy pad may be in a partially cured state that is not sticky. The B-stage epoxy pad may be relatively thin and therefore does not impede the movement of components while they are being positioned. Once the components are properly positioned, the entire surface and components may be heated to activate the B-stage epoxy and thereby permanently affix the components to the surface.

In other embodiments, other types of known or later developed adhesives may be used that may initially not impede the movement of components and that can be activated once the components are correctly oriented at the specific locations.

In this manner, large batches of components may be positioned on a surface and captured at specified locations in an efficient parallel manner.

Other Embodiments

While the disclosure has been described with reference to illustrative embodiments, this description is not intended to be construed in a limiting sense. Various other embodiments of the disclosure will be apparent to persons skilled in the art upon reference to this description. For example, while positioning IC die on a leadframe was described herein, other embodiments may be used to position various types of electronic components on a different surface, such as on a printed circuit board.

In some embodiments, a first set of components may be captured while the magnetic domains are activated in one pattern, and then a second set of different components may be captured while the magnetic domains are activated in a second pattern. Additional types of components may be positioned by repeating this process.

In another embodiment, two or more IC die may be positioned and captured in close proximity to each other, even in a side-by-side arrangement. Such close placement is typically not possible with traditional pick and place machinery.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and then loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A method comprising:
placing at least first and second integrated circuit (IC) die on a first surface of a leadframe strip, the leadframe strip having a second surface opposite the first surface, and the first and second IC die respectively including first and second magnetically responsive structures;
agitating the first and second IC die; and
magnetically attracting the first and second IC die to be positioned at particular locations on the first surface, including by activating selected ones of an array of magnetic domains that are positioned proximate the second surface.

2. The method of claim 1, further comprising affixing the first and second IC die to the particular locations.

3. The method of claim 1, wherein the magnetic domains are electromagnetic domains.

4. The method of claim 3, further comprising moving a particular one of the first and second IC die across the first surface, including by selective activation of the electromagnetic domains.

5. The method of claim 4, further comprising observing the first and second IC die, and controlling the movement of the particular one of the first and second IC die in response to the observation.

6. The method of claim 3, further comprising:
determining a vertical orientation of the first and second IC die to identify a particular one of the first and second IC die that is upside down; and
activating selected ones of the electromagnetic domains to flip the particular one of the first and second IC die right side up.

7. The method of claim 1, wherein the first magnetically responsive structure is inherently part of the first IC die, and the second magnetically responsive structure is inherently part of the second IC die.

8. The method of claim 1, wherein the first and second magnetically responsive structures are patterned interconnect layers.

9. The method of claim 1, wherein activating the selected magnetic domains includes wirelessly transferring power thereto.

10. A method comprising:
placing at least first and second components on a surface, the first and second components respectively including first and second magnetically responsive structures;
agitating the first and second components;
magnetically attracting the first and second components to be positioned at particular locations on the surface, including by activating selected ones of an array of magnetic domains under the surface; and
calibrating the first and second magnetically responsive structures to determine a dominant magnetic response orientation to the array of magnetic domains.

11. The method of claim 10, wherein magnetically attracting the first and second components includes orienting each of the first and second components in a particular orientation, including by selectively activating electromagnets at each of the particular locations in accordance with the dominant magnetic response orientation.

12. A method comprising:
placing at least first and second components on a first surface, the first and second components respectively including first and second magnetically responsive structures;
agitating the first and second components;
magnetically attracting the first and second components to be positioned at particular locations on the first surface, including by activating selected ones of an array of magnetic domains under the first surface; and transferring the first and second components to a second surface after magnetically attracting the first and second components to be positioned at the particular locations on the first surface.

13. The method of claim 12, wherein the first and second components are integrated circuit (IC) die, the second surface is a flip chip leadframe strip, the first magnetically responsive structure is printed on a bottom side of the first component, and the second magnetically responsive structure is printed on a bottom side of the second component, such that the first and second components are positioned upside down on the first surface.

14. A method comprising:
printing a first magnetically responsive structure on a first integrated circuit (IC) die;
printing a second magnetically responsive structure on a second IC die;
placing at least the first and second IC die on a leadframe;
agitating the first and second IC die; and
magnetically attracting the first and second IC die to be positioned at particular locations on the leadframe by an array of magnetic domains that produce a magnetic response from the first and second IC die.

15. The method of claim 14, further comprising positioning a magnetic chuck proximate the leadframe, wherein the array of magnetic domains is located in the magnetic chuck.

16. The method of claim 15, further comprising activating selected ones of an array of electromagnets to form the array of magnetic domains.

17. The method of claim 14, further comprising affixing the first and second IC die to the particular locations, including by heating the leadframe.

18. The method of claim 14, wherein the particular locations on the leadframe are other IC die on the leadframe.

* * * * *